United States Patent
Henry et al.

(10) Patent No.: US 11,158,613 B2
(45) Date of Patent: *Oct. 26, 2021

(54) COLOUR INORGANIC LED DISPLAY FOR DISPLAY DEVICES WITH A HIGH NUMBER OF PIXEL

(71) Applicant: Facebook Technologies, LLC, Menlo Park, CA (US)

(72) Inventors: William Henry, Cork (IE); Padraig Hughes, Cork (IE); Joseph O'Keeffe, Bellevue, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/882,197

(22) Filed: May 22, 2020

(65) Prior Publication Data

US 2020/0343228 A1 Oct. 29, 2020

Related U.S. Application Data

(63) Continuation of application No. 16/269,505, filed on Feb. 6, 2019, now Pat. No. 10,707,191, which is a
(Continued)

(30) Foreign Application Priority Data

Jul. 31, 2014 (GB) ..................... 1413604

(51) Int. Cl.
*H01L 25/075* (2006.01)
*H01L 27/15* (2006.01)
(Continued)

(52) U.S. Cl.
CPC ........ *H01L 25/0753* (2013.01); *H01L 27/156* (2013.01); *H01L 33/10* (2013.01);
(Continued)

(58) Field of Classification Search
CPC ..... H01L 25/0753; H01L 33/10; H01L 33/24; H01L 33/58; H01L 33/60; H01L 27/156
See application file for complete search history.

(56) References Cited

U.S. PATENT DOCUMENTS 7,518,149 B2 4/2009 Maaskant et al.
7,997,771 B2 8/2011 Epstein et al.
(Continued)

FOREIGN PATENT DOCUMENTS

CN 103928498 A 7/2014
EP 1544928 A2 6/2005
(Continued)

OTHER PUBLICATIONS

European Patent Office, Examination Report, European Patent Application No. 15744930.7, dated Apr. 9, 2020, six pages.
(Continued)

*Primary Examiner* — Quoc D Hoang
(74) *Attorney, Agent, or Firm* — Fenwick & West LLP

(57) ABSTRACT

An image generator for use in a display device, the image generator comprising a plurality of ILED array chips each comprising a plurality of ILED emitters and arranged in an array such that each of a plurality of pixels of the image generator comprises an ILED emitter from each of a plurality of adjacent ILED array chips. The total area of ILED emitter material be less than 50% of the area of each pixel. The image generator may comprise secondary optics in optical communication with an output of the plurality of ILED emitters of an ILED array chip and configured to direct light from the ILED emitters towards an emission region of the associated pixel.

19 Claims, 6 Drawing Sheets

Related U.S. Application Data continuation of application No. 15/329,554, filed as application No. PCT/EP2015/067751 on Jul. 31, 2015, now Pat. No. 10,262,977.

(51) Int. Cl.
*H01L 33/10* (2010.01)
*H01L 33/24* (2010.01)
*H01L 33/58* (2010.01)
*H01L 33/60* (2010.01)

(52) U.S. Cl.
CPC .............. *H01L 33/24* (2013.01); *H01L 33/58* (2013.01); *H01L 33/60* (2013.01)

(56) References Cited

U.S. PATENT DOCUMENTS

| | | | |
|---|---|---|---|
| 10,262,977 B2* | 4/2019 | Henry | ............. H01L 33/60 |
| 2004/0042585 A1 | 3/2004 | Nagarkar et al. | |
| 2008/0231554 A1 | 9/2008 | Lee | |
| 2009/0302331 A1 | 12/2009 | Smith et al. | |
| 2011/0032702 A1* | 2/2011 | Mizuno | ............. H01L 25/0753 |
| | | | 362/247 |
| 2011/0062457 A1 | 3/2011 | Naito et al. | |
| 2012/0147314 A1 | 6/2012 | Yoshizawa et al. | |
| 2013/0207964 A1* | 8/2013 | Fleck | ............. H01L 27/153 |
| | | | 345/419 |
| 2016/0245980 A1 | 8/2016 | He | |
| 2017/0213502 A1 | 7/2017 | Henry et al. | |

FOREIGN PATENT DOCUMENTS

| | | |
|---|---|---|
| JP | 2003029654 A | 1/2003 |
| JP | 2008503034 A | 1/2008 |
| JP | 2009533810 A | 9/2009 |
| WO | WO 2004/097947 A2 | 11/2004 |
| WO | WO 2011/046887 A1 | 4/2011 |

OTHER PUBLICATIONS

PCT International Search Report and Written Opinion, PCT/EP2015/067751, dated Oct. 21, 2015, 9 Pages.
The Japan Patent Office, Office Action, Japanese Patent Application No. 2019-136322, dated Sep. 1, 2020, seven pages.
European Patent Office, Extended European Search Report, European Patent Application No. 21165272.2, dated May 31, 2021, eight pages.

* cited by examiner

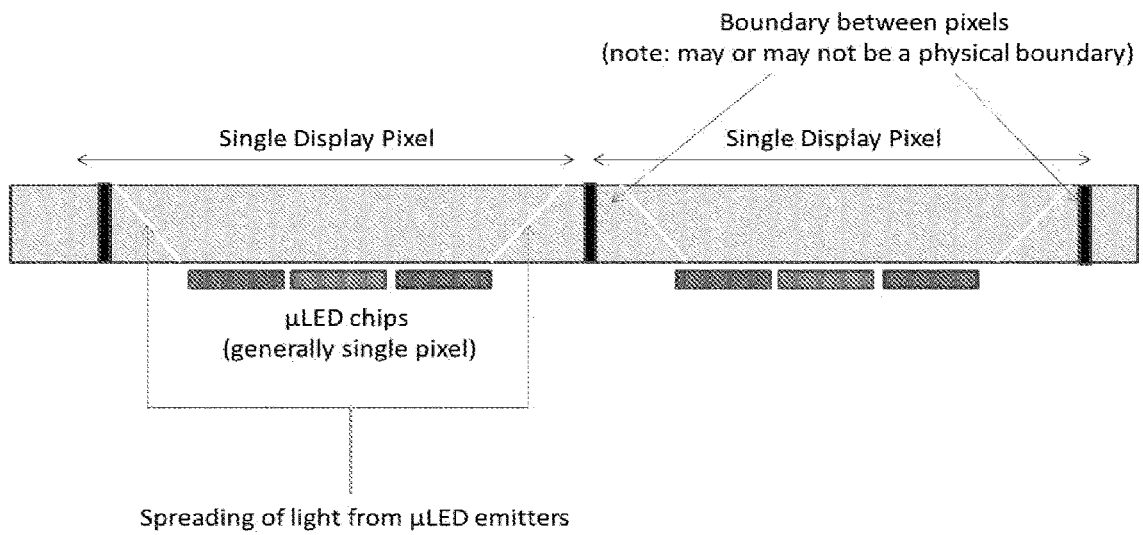
Fig. 1
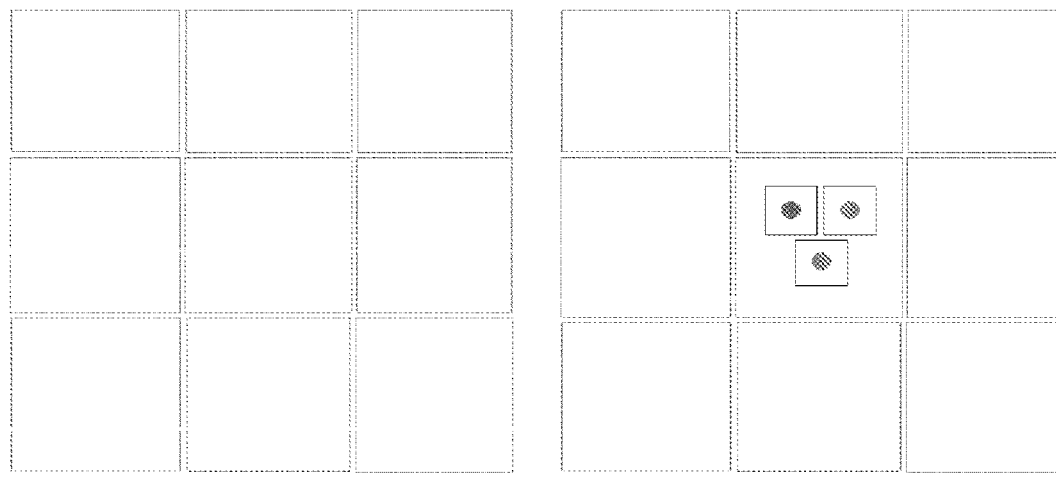
Fig. 2(a)    Fig. 2 (b)

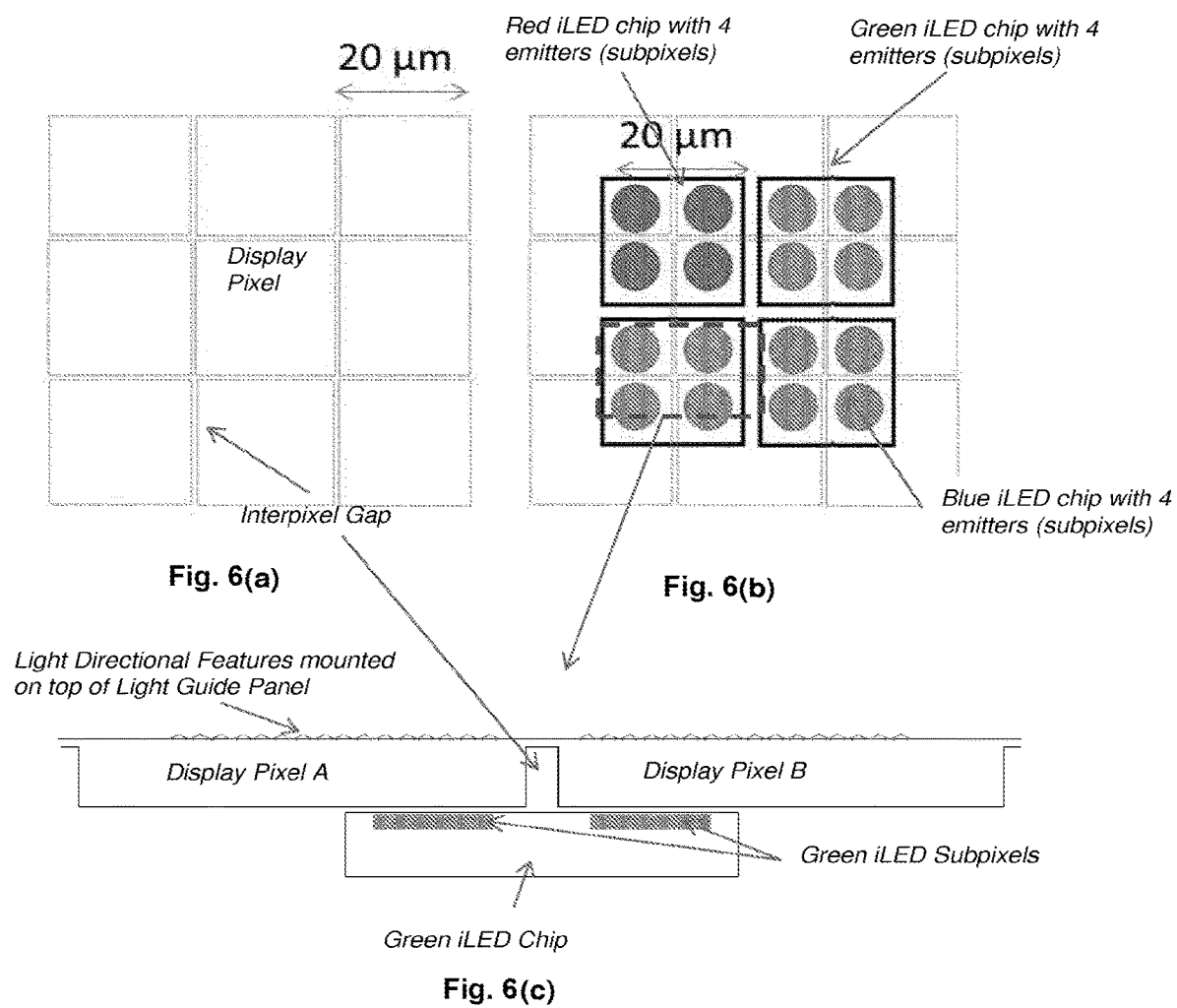

COLOUR INORGANIC LED DISPLAY FOR DISPLAY DEVICES WITH A HIGH NUMBER OF PIXEL

CROSS REFERENCE TO RELATED APPLICATIONS

This application is a continuation of U.S. application Ser. No. 16/269,505, filed Feb. 6, 2019, which is a continuation of U.S. application Ser. No. 15/329,554, filed Jan. 26, 2017, now U.S. Pat. No. 10,262,977, which is a National Phase Application of International Application No. PCT/EP2015/067751, filed Jul. 31, 2015, which claims the benefit of United Kingdom Application No. 1413604.8, filed Jul. 31, 2014, each incorporated by reference in its entirety.

TECHNICAL FIELD

The invention relates to an image generator. Specifically, the invention relates to, but is not limited to, an image generator that efficiently uses light and ILED real estate leading to enhanced power efficiency in large area/higher resolution displays while solving manufacturability issues and achieving a cost that is competitive with other display types.

BACKGROUND

The current state of the art comprises of the arrangement of R, G and B display subpixels to form a single display pixel. A typical configuration for a low resolution display is highlighted in FIG. 1, where discrete R, G and B ILED chips are packed together to provide the necessary light for each pixel of the display. In this example, each R, G and B chip has one emitter per chip. The typical/minimum size of these R, G, B chips is 50 µmt×50 µmt. For larger displays with moderate resolution the one to one relationship between ILED chips and display sub pixel results in the requirement for a very large number of ILED chips. This raises significant manufacturability and cost challenges. For ultra-high resolution displays the size of the ILED chips limits the area and size of the pixel display and thus the overall display resolution. In this instance, the display pixel size is limited to 100 µmt×100 µmt area which is not sufficient to achieve a high resolution display sub 20 µmt×20 µmt in area.

An alternative approach may be to reduce the size of ILED chips. It is technically complicated and challenging to manufacture and place chips that are smaller than 20×20 µmt on a substrate or driver backplane, which therefore limits the display pixel size (albeit at a low level). In addition this does not address the issue of the number of placement steps required. This would therefore remain technically and financially challenging.

SUMMARY

According to an aspect of the invention, there is provided an image generator for use in a display device, the image generator comprising: a plurality of I LED array chips each comprising a plurality of ILED emitters and arranged in an array such that each of a plurality of pixels of the image generator comprises an ILED emitter from each of a plurality of adjacent ILED array chips, and wherein the total area of ILED emitter material is less than 50% of the area of each pixel.

Optionally, the total area of ILED emitter material is in a range from 5% to 10% of the area of each pixel.

Optionally, the image generator further comprising secondary optics in optical communication with an output of the plurality of ILED emitters of an ILED array chip and configured to direct light from the ILED emitters towards an emission region of the associated pixel.

Optionally, the secondary optics comprise one or more of: reflective structures, light turning optics, light extraction features, Fresnel type structures, printed optics, etched optics, holographic optics, diffraction grating or other type of optical component.

Optionally, the light extraction features are configured to reduce or remove internal reflection of the secondary optics, such that light is emitted from the secondary optics.

Optionally, the size and/or shape of the pixel emission region is determined by the size and shape of the light extraction features.

Optionally, the image generator further comprising a diffuse light guide panel at the output.

Optionally, the diffuse light guide panel comprises an interpixel region defining each pixel of the display device and configured to prevent interpixel cross talk.

Optionally, the interpixel region comprises a gap.

Optionally, the gap is at least partially filled with one or more of a dielectric material and a reflective material.

Optionally, each ILED chip has a monolithic structure.

Optionally, the plurality of ILED emitters on each ILED array chip are configured to emit light of substantially the same colour.

Optionally, the colour is one of red, green and blue.

Optionally, the plurality of ILED emitters on each ILED array chip are configured in a 2×2 matrix.

Optionally, the ILED array chips are one of square, rectangular, triangular, circular and polygonal in shape.

Optionally, each of the plurality of ILED emitters on each ILED array chip are mounted at a corner of the ILED array chip.

Optionally, the ILED emitters are mounted on a substantially transparent carrier such that the emitted light propagates through the carrier.

Optionally, the secondary optics are directly integrated with the ILED array chip.

Optionally, the secondary optics are directly integrated with the light guide panels.

Optionally, the ILED emitters comprise micro ILED emitters.

According to an aspect of the invention, there is provided an image generator for use in a display device comprising: a plurality of ILED array chips each comprising a plurality of ILED emitters and arranged in an array such that each of a plurality of pixels of the display device comprises a ILED emitter from each of a plurality of adjacent ILED array chips; and secondary optics in optical communication with an output of the plurality of ILED emitters of a ILED array chip and configured to direct light from the ILED emitters towards an emission region of the associated pixel.

Optionally, the secondary optics comprise one or more of: reflective structures, light turning optics, light extraction features, Fresnel type structures, printed optics, etched optics, holographic optics, diffraction grating or other type of optical component.

Optionally, the light extraction features are configured to reduce or remove internal reflection of the secondary optics, such that light is emitted from the secondary optics.

Optionally, the size and/or shape of the pixel emission region is determined by the size and shape of the light extraction features.

Optionally, the image generator further comprising a diffuse light guide panel at the output.

Optionally, the diffuse light guide panel comprises an interpixel region defining each pixel of the display device and configured to prevent interpixel cross talk.

Optionally, the interpixel region comprises a gap.

Optionally, the gap is at least partially filled with one or more of a dielectric material and a reflective material.

Optionally, the ILED emitters are mounted on or embedded into a substantially transparent carrier such that the emitted light propagates through the carrier.

Optionally, the secondary optics are directly integrated with the ILED chip.

Optionally, the secondary optics are mounted on or embedded into the light guide panels.

Optionally, the ILED emitters comprise micro ILED emitters.

According to an aspect of the invention, there is provided a display device comprising an image generator according to any preceding claim.

This invention aims to mitigate or solve one or more of the problems with the prior art. The invention greatly reduces the issues associated with cost, manufacturability and minimum pixel size.

According to the invention in a first aspect, there is provided a display device comprising: a plurality of ILED chips each comprising a plurality of LED devices and arranged in an array such that each of a plurality of pixels of the display device comprises one or more LED devices from a plurality of adjacent I LED chips.

Optionally, the LED devices comprise one or more LED devices.

Optionally, the display device further comprises secondary optics in optical communication with an output of the plurality of LED devices of an I LED chip and configured to direct light from an LED device towards the associated pixel.

Optionally, the secondary optics may be directional optics to manipulate and control the light path direction from the I LED chip to and within and from the light guide panel. The secondary optics can comprise one or more of: reflective structures, light turning optics, backreflectors, light extraction features, Fresnel type structure, printed optics, etched optics, holographic optics, diffraction grating optics or other type of optical component.

Optionally, the display device further comprises a diffuse light guide panel at the output, wherein the diffuse optical layer comprises an interpixel region defining each pixel of the display and configured to prevent interpixel cross talk.

Optionally, the interpixel region comprises a gap.

Optionally, the gap is at least partially filled with one or more of a dielectric material and a reflective material.

Optionally, each I LED chip has a monolithic structure.

Optionally, the plurality of LED devices on each ILED chip are configured to emit light of substantially the same colour.

Optionally, the colour is one of red, green and blue.

Optionally, the plurality of LED devices on each ILED chip are configured in a 2×2 matrix.

Optionally, the ILED chips are one of square, rectangular, triangular, circular and polygonal in shape.

Optionally, the plurality of LED devices on each ILED chip define one of a square, a rectangle, a triangle, a circle and a polygon.

Optionally, the ILED devices are mounted on a substantially transparent carrier such that the emitted light propagates through the carrier.

Optionally, the secondary optics are directly integrated with the ILED chip.

Optionally, the secondary optics are directly integrated with the light guide panels.

Optionally the ILED chips are embedded into the light guide panels with integrated secondary optics.

BRIEF DESCRIPTION OF THE DRAWINGS

Exemplary embodiments of the invention are discussed herein with reference to the accompanying drawings, in which:

FIG. 1 is basic side view of standard ILED type display for lower resolution applications and smaller screen sizes;

FIG. 2A is a low resolution pixel display—the typical pixel display size is 100 μm×100 μm;

FIG. 2B is an exemplary display in which each display pixel is illuminated by 3 ILED chips (R, G and B). Typical chips size is 50 μm×50 μm;

FIG. 6A is a Light Guide Panel as an example of secondary optics;

FIG. 6B is a light guide panel integrated with ILED chips for H D display solution. In this example, the Display pixel size is 20 μm×20 μm. The ILED chip size is equivalent in area to the display pixel size and has 4 subpixels which are 5 μm×5 μm in area;

FIG. 6C is a cross section through two neighboring pixels A and B highlighting interpixel gap and light directing structures by way of example to steer and control the light in the display emission area;

DETAILED DESCRIPTION

Overview

Figure 3:
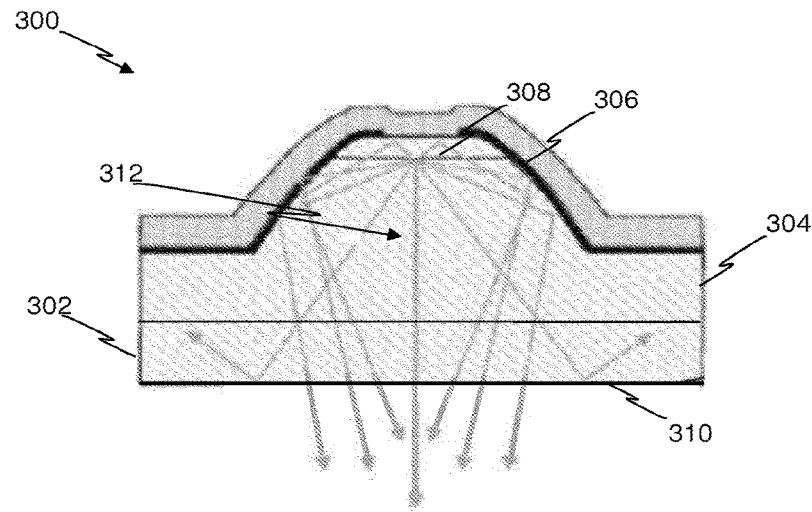
FIG. 3 shows a schematic representation of a micro I LED emitter.

Disclosed herein is a novel ILED display, which may be based on the high efficiency ILEDs that may be coupled with a light guide panel and can be used for display applications with a high number of pixels, due to larger screen sizes, high display resolution or other performance requirements.

Specific exemplary devices and methods, relate to an inorganic light emitting diode (ILED) image generator with a high number of pixels, having improved power efficiency. The requirement for a high number of pixels may be due to a large screen size with a moderate resolution or a small screen size with an ultra-high resolution.

In the case of the former this invention is applicable to portable electronic devices such as mobile phones, tablet computers, monitors and televisions. In the case of the latter, exemplary devices and methods may also be used for small displays with ultra-high resolution where the limiting factor is the minimum size of the light source to be manipulated. Examples of such an application include a near-to-the-eye micro-display such as used in thermal images or helmet mounted systems and pico-projectors.

As used herein, the term "image generator" encompasses an array of ILED (or µILED) array chips that provide light for a plurality of pixels. The ILED array chips comprise a plurality of ILED emitters, may be monolithic and may generate light all of a single colour. Each ILED emitter of an ILED array chip provides light to one of adjacent pixels of the image generator. The image generator may be considered as a single device that provides a light source and an image engine of a display.

The methods and apparatus disclosed present a manufacturable solution for ILED displays where there are a large number of pixels. This may be due to a large display that has a moderate or high resolution; or a small display that has an ultra-high resolution (and hence a large number of pixels).

An exemplary display module comprises
1. A plurality of ILED array chips each of a single color (i.e. R, G and B emission wavelengths).
2. Each ILED array chip comprising one or a plurality of individual ILED emitters, where the individual ILED emitters may form sub pixels of a display, as set out below.
3. Apparatus and a corresponding method for controlling the light from the ILED emitters, such that the light is appropriately spatially positioned to form the sub pixels of the display.—"secondary optics".
4. Display pixel emission region, which is an emission area for light from a combination of R, G and B color ILED emitters.

In particular the invention discloses a method of manufacturing a display with a high number of display pixels and reducing or minimizing the number of ILED array chips that are required in the display. The invention has applications for larger area (>1" diagonal) displays and ultra-high resolution displays while achieving a cost base that is competitive to other display types.

In exemplary methods and apparatus, the ILED emitters may be ILED (µILED) emitters, as disclosed herein.

The invention represents a simpler manufacturing solution for achieving high resolution displays whereby ILED array chips are manufactured comprising a plurality of individual sub pixels. That is, the ILED array chips may comprise a plurality of ILED emitters and each ILED emitter may form a sub pixel on a different pixel. A sub pixel being one of a plurality of light emitting devices required to make up a pixel. Typically, sub pixels may emit light at wavelengths corresponding to one of red, green or blue light.

This invention is related to a display type where a ILED array chip is used as the light source and image generator. It is distinct from LCD based displays (where the light source may be an LED via a backlight) but the image generator is a liquid crystal module.

This invention overcomes this issue by manufacturing ILED chips containing one or a plurality of ILED emitters on a single ILED array chip. Specifically, the invention disclosed involves the sharing of light emission from a single ILED array chip comprising multiple sub pixels with neighboring display pixels. The ILED array chip may be shaped according to the number of ILED emitters formed on it. In exemplary methods and apparatus, each ILED emitter may be positioned at a corner or near the edge extremity of the ILED array chip. For example a ILED array chip with 3 ILED emitters may be in the shape of a triangle. A ILED array chip with 4 ILED emitters may be square. A ILED array chip with 6 ILED emitters may be hexagonal. The skilled person will understand that other corresponding configurations are possible.

Exemplary devices use light controlling structures, which may be in the ILED emitter. This ensures that there is minimal cross-talk between the ILED emitters that are on the same ILED array chip (i.e. crosstalk across pixels). The light controlling structure allows the generated light to be directed from the ILED emitter in a quasi-collimated fashion. This allows the light to reach secondary optics in a well-defined manner thus allowing the secondary optics to perform effectively.

FIG. 2 discloses a low resolution pixel display with the typical pixel display size in this example being 100 µηt×100 µηt. FIG. 2(b) is an exemplary display in which each display pixel is illuminated by 3 ILED chips (R, G and B). Typical chip size is 50 µηt×50 µηt. Other classic pixel matrix configurations include stripe pixel designs consisting of 3 subpixels; i.e. 1 R, 1 G & 1 B and square pixel designs consisting of 4 subpixels which consists of a least 1 R, 1 G and 1 B subpixel. In this configuration it may also contain 1 yellow (Y) subpixel.

The ILED emitters may be ILED emitters as shown in FIG. 3, which shows a ILED structure 100 similar to that proposed in WO 2004/097947 (U.S. Pat. No. 7,518,149) with a high extraction efficiency and outputting quasi-collimated light because of its shape. Such an ILED 300 is shown in FIG. 3, wherein a substrate 302 has a semiconductor epitaxial layer 304 located on it. The epitaxial layer 104 is shaped into a mesa 306. An active (or light emitting) layer 308 is enclosed in the mesa structure 306. The mesa 306 has a truncated top, on a side opposed to a light transmitting or emitting face 310. The mesa 306 also has a near-parabolic shape to form a reflective enclosure for light generated or detected within the device. The arrows 312 show how light emitted from the active layer 308 is reflected off the walls of the mesa 306 toward the light exiting surface 310 at an angle sufficient for it to escape the LED device 300 (i.e. within the angle of total internal reflection).

Figure 4:
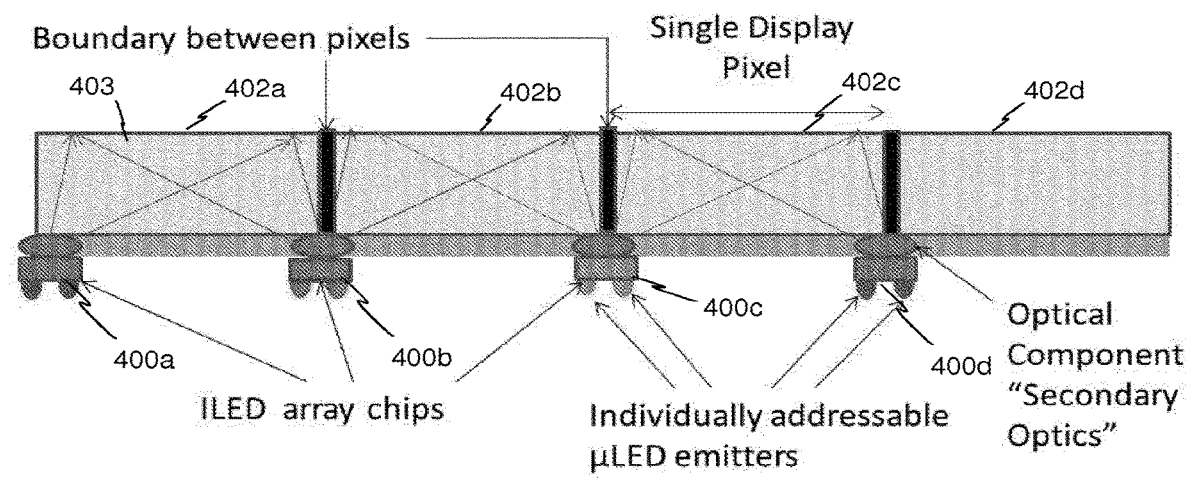
FIG. 4 is a simplified side view of an I LED display for high resolution and large area displays where the light from neighboring ILED devices is shared amongst display pixels.
Figure 5A:
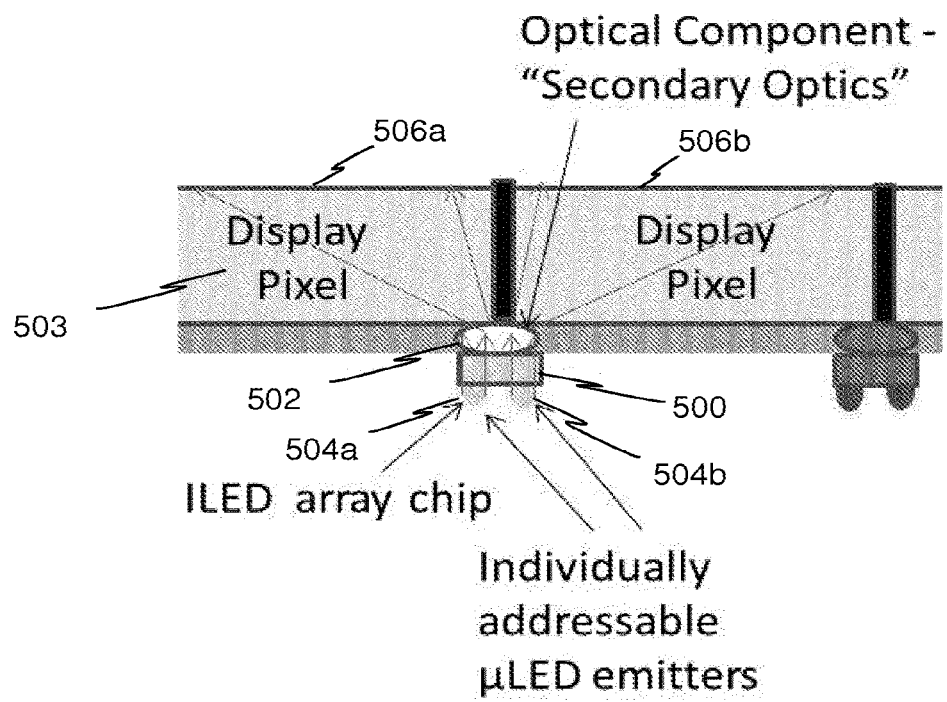
FIG. 5A is an image of the use of secondary optics to spatially direct the light emitted from LED emitters on the same ILED chip.

The I LED array chips may positioned relative to other I LED array chips such that the ILED emitters are shared equally between nearest neighbor display pixels, as shown in FIG. 4. FIG. 4 is an image of multiple ILED array chips 400a-d with the light from a single ILED array chip 400a-d being emitted from adjacent pixels 402a-d. The pixels 402a-d may comprise a light guide panel 403, the operation of which is discussed below. Each pixel 402a-d may comprise at least one discrete light guide panel 403, or the light guide panel 403 may be used for a plurality of pixels 402a-d. FIG. 5a shows a single ILED array chip 500 with the secondary optics 502 being used to separate light from emitters 504a-b into different pixels 506a-b.

The ILED array chip size does not need to be small chips as they are designed with multiple ILED emitters which are utilized in a suitable configuration. In exemplary methods and apparatus, each ILED emitter contributes to an individual sub pixel of the display pixel. In this way, each ILED array chip will contribute to multiple display pixels. As an ILED array chip contains multiple ILED emitters the number of placement steps for a given number of pixels is reduced. In exemplary methods and apparatus, the use of a common cathode for the ILED array chips reduced the number of contacts required in a display.

An example of a suitable configuration is the following based on square or rectangular ILED array chips which contain 4 sub pixel emitters are shown in FIG. 5(a). The integration of multiple ILED emitters per array chip allows for the design of ultra-small display pixels. For example, a 20×20 μηt chip may contain 6 ILED emitters. However, a display pixel may require only 3 ILED emitters (e.g., 1 for R, G and B—albeit from different ILED array chips). Therefore with the appropriate positioning of the ILED array chips, a display smaller than the minimal ILED array chip size could be created. This is a route to ultra-high resolution displays with high efficiency.

The emission from the ILED emitters may be directed and diffused into the appropriate spatial position to form a display pixel via a number of methods and apparatus. These methods are herein referred to as the secondary optics.

Figure 5B:
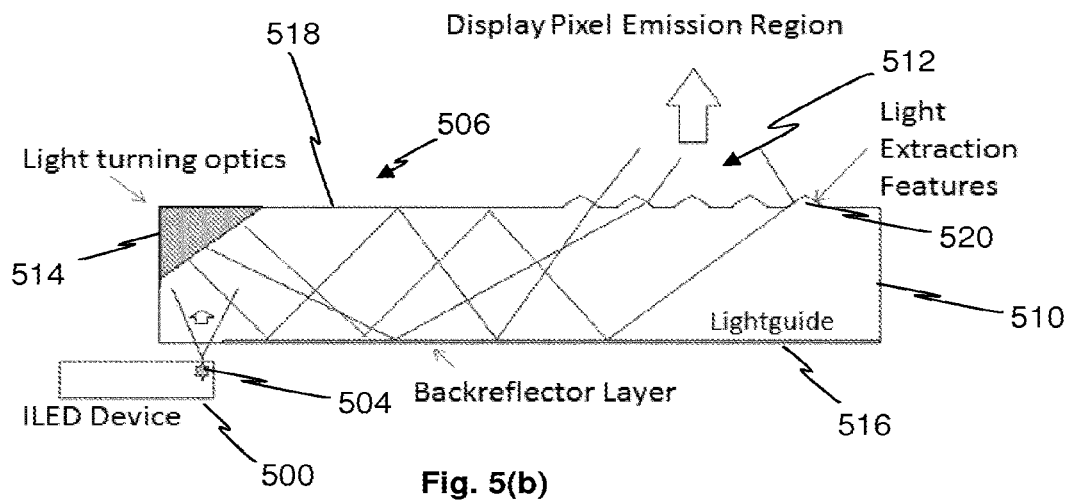
FIG. 5B is an expanded image of the use of secondary optics to spatially position light from one LED emitter on the same I LED chip.

One such method is a light guide panel 510 (see FIGS. 5(b) & 6). The secondary optics may comprise a lightguide panel 510 that is configured to direct light emitted from a display sub pixel (i.e. an ILED emitter) towards a display pixel emission region 512. The lightguide panel 510 may be configured such that the R, G & B colors can be intermixed in the pixel display emission area 512. Note that in this application the term "light guide" encompasses to a transparent or translucent material that allows light to propagate from one point to another. In certain embodiments, this may also result in restrictions in the directionality of the light.

Figure 7:
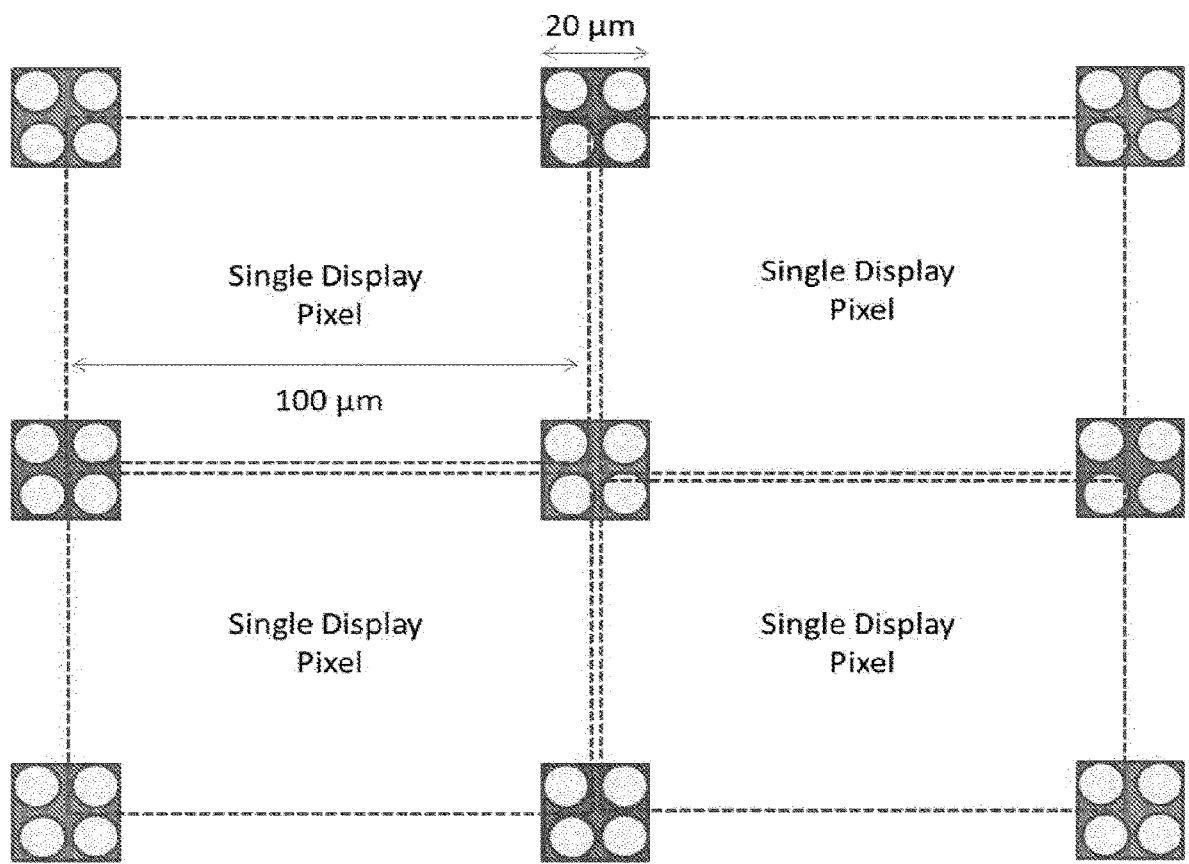
FIG. 7 is an example of pixel layout with a larger pixel size. Note that the ILED chip size does not need to increase to accommodate the large display pixel size. This enables the fabrication of displays of increased size without the need to increase the amount of wafer material or chip interconnects required.
Figure 8:
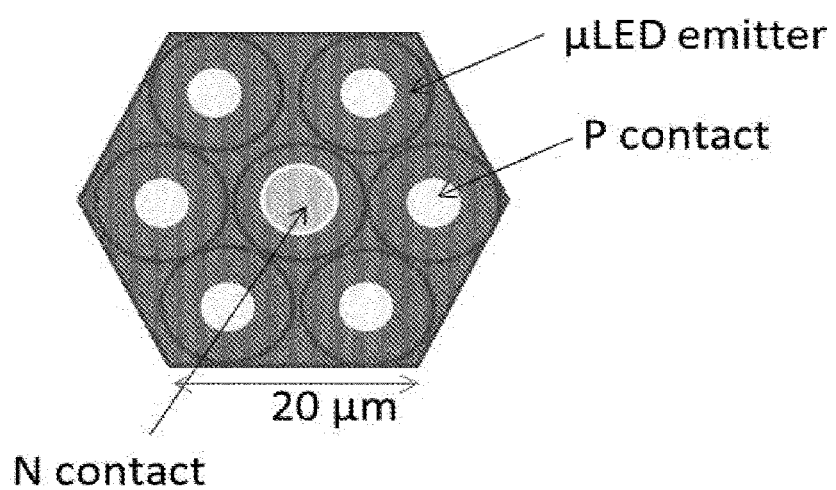
FIG. 8 is an example of a hexagon I LED chip with 6 I LED emitters. Each of the I LED can be used to illuminate alternative display pixels.

As demonstrated in FIG. 5(b), the collimated light emission pattern from the ILED emitters 504 is directly coupled into the lightguide 510 by butt coupling the ILED array chip 500 to the lightguide 510. This may be done using a light index matching layer. The emitter 504 may be positioned at a corner of the display pixel 506a, as shown in FIG. 7. However, the light from the emitter 504 may need to be propagated to a different area of the pixel 506, such as the display pixel emission region 512. The lightguide 510 may comprise light turning reflector optics 514 configured to internally reflect the light rays coupled into the lightguide 510, such that they are directed to the desired region. The light turning reflector optics 514 may be positioned substantially in the path of light entering the lightguide panel 510 from the emitter 504 and in particular methods and apparatus may comprise a corner reflector positioned in a corner of the lightguide panel 510. The light turning reflector optics 514 may be configured to turn the light emitted from the emitter 504 by 90 degrees to reflect the light rays. The lightguide may comprise further features, such as a backreflector layer 516 configure to reflect light internally such that light rays propagate along the lightguide 510 by a combination of total internal reflection (from an output surface 518) and the optional backside reflective mirror or features 516. Light reaching the pixel emission region 512 may then be extracted using light extraction features 520 which define the pixel emission region 512. The light extraction features 520 are configured to direct light out of the lightguide 510 at the pixel emission region 512 and may comprise ridged features that reduce or remove the internal reflection properties of the output surface 518. The pixel size and shape may be defined by the light extraction features 520 and these can be varied to control the shape and size of the pixel emission size. The light extraction features 520 can be mounted directly onto the surface of the lightguide 510 (as shown in FIG. 5(b)) or physically etched into the light guide 510. The example shown shows LEDs coupled to a thin film lightguide 510 but it is also appreciated here that the I LED array chips can be embedded directly into the thin lightguide layers.

In exemplary methods and apparatus, the ILED array chip may be embedded in the lightguide. In such methods and apparatus, a recess may be machined in the secondary optics and an ILED array chip may be positioned in the hole such that an upper surface of the ILED array chip is flush with or below the surface of the lightguide. Optionally, a filling compound may be injected into the recess to retain the ILED array chip in position and the external surface of the lightguide may be planarized.

In this embodiment the light support panel or light guide panel provides for
1. the controlled directionality of light emitted from an ILED emitter within a pixel
2. the controlled separation of light emitted from ILED emitters of a single ILED array chip between neighboring pixel displays, i.e. the removal of interpixel crosstalk.

As such, the secondary optics (i.e. directional optics) are configured to direct light emitted from ILED emitters of a ILED array chip along the light guide towards the pixel emission area. Exemplary secondary optics may direct light towards a central region of the pixel.

To control the light directionality, the light guide panel may consist of a series of optical components e.g. light turning optics, microlens, laser machined light structures for controlled light reflection or a reflector in combination with a diffuse plate. The light guide panel consists of light scattering structures which may direct the light from each ILED emitter (sub pixel) and converge it into the region of interest namely across the surface of the pixel, in exemplary methods and apparatus, the secondary optics are on the side where light is injected into the light guide. The secondary optics may be positioned between a light emitting face of an ILED emitter and the light guide. Additional optical components may be used at the exit face of the light guide (which may also be the exterior face of the electronic device) to further control the light for various benefits.

To control the separation of light between neighboring pixels in the display, the light guide panel can be machined such that it is subdivided into arrays of optically independent pixels having interpixel gaps between the optically independent pixels. The interpixel gaps can extend partially through the light guide panel or all the way through the light guide. This is one method of the secondary optics.

The optically independent pixels are configured to channel detectable light to the pixel emission area thereby reducing optical crosstalk between the pixels and increasing light efficiency of the display, and maintaining a high spatial resolution necessary for HD display applications. The interpixel gaps may be filled with a dielectric and or optically reflective material to substantially reduce optical crosstalk and enhance light collection efficiency within the pixel. The light panel guide is transparent and can be machined using glass or polymer based materials such as PMMA or PVC.

In another exemplary embodiment the secondary optics for the spatial positioning may be provided by independent optical components. In other exemplary embodiments, the secondary optics may be integrated with the transparent carrier layer of the display. In another exemplary embodiment, the optical components can be directly integrated with the I LED array chip. This may be on the opposite side from the area where the light is generated and enters the light guide panel. The optics can be in a number of forms. The optics may be formed using reflective structures, Fresnel type structures, printed optics, etched optics, diffraction gratings or any other applicable method. The use of a µILED emitter to efficiency couple the generated light to the secondary optics improves the efficiency performance of the display.

The quasi-collimated light produced by the ILED emitters also enables the secondary optics to perform in a predicable way. The quasi-collimated light minimizes the cross-talk between the ILED emitters on the ILED array chip and as such reduces the cross-talk between display pixels. The quasi-collimated light inside the ILED array chip due to the ILED emitter structure allows the ILED emitters to be placed closely together and hence reduces the ILED array chip size. An example of the control of light using optical structures is given in FIG. 4 with further detail provided in FIG. 5.

A mixture of multiple solutions may be used to control the light. For example, a secondary optics component may be used to direct the light towards the display pixel. As part of the transparent layer there may be grooves on one surface that further separate the light between pixels and reduce cross-talk. Other components may also be included to further enhance the performance.

Note in FIG. 6(a) the target display pixel size is shown as 20×20 µm—i.e. ultra-high resolution. For displays of lower resolution, i.e. most current mobile phones, tablets or televisions the size of display pixel would be significantly larger. However, with the current invention the size or number of the ILED array chip does not need to increase with increasing display pixel size. Therefore the fill factor within the pixel can be relatively low and the amount of material required to fabricate a larger display with a lower resolution is equivalent to that of a small display with ultra-high resolution. Another way of explaining this is that the total amount of ILED material and the number of ILED array chip placement steps required is dependent on the number of pixels and not the size of the display. In addition, the use of the multiple sub pixels per ILED array chip reduces the number of placements and interconnects required for a given pixel count.

The term "fill factor" as used herein encompasses the ratio of ILED material in relation to the total area of the pixel. This may also be expressed as a percentage of the total pixel area.

FIG. 7 shows a layout for a display with a larger pixel size shown than that in FIG. 6. The secondary optics are removed in this diagram. Exemplary methods and apparatus may include the secondary optics, but the quasi-collimated light emitted by the ILED emitters means that the secondary optics are not essential. Note that the pitch between the ILED array chips is increased for the larger pixel size and is shown in FIG. 7 as being 100 However, the number of ILED array chips and the size of the ILED array chips does not increase with respect to the smaller display of FIG. 6. This enables a larger display to be fabricated without the need for an increase in the ILED array chip area or the number of interconnections. This invention therefore overcomes a number of the manufacturability and cost issues associated with the fabrication of ILED displays in larger devices.

In exemplary methods and apparatus, the fill factor of the ILED material of the ILED array chips within the total pixel area is less than 50%. In other exemplary methods and apparatus, the fill factor is less than 20%. In other exemplary methods and apparatus, the fill factor is less than 10%. In other exemplary methods and apparatus, the fill factor is less than 5%. And in specific exemplary methods and apparatus, the fill factor is in a range from 5% to 10%.

Secondary optics may be added to reduce interpixel crosstalk and/or to mix the light from a plurality of I LED emitters from adjacent ILED array chips.

FIG. 5 shows a simplified side view of the ILED display for higher resolution and larger displays. A single ILED array chip 500 will contain multiple addressable sub pixel emitters 504a-b. Each of these sub pixels can be used to couple light to a different display pixel 506a-b. This is achieved using a secondary optics component 502 that may be mounted directly on the ILED emitter or may be on the transparent carrier (or light guide plane) 503. In the case of FIG. 5 the secondary optics component 502 is mounted directly to the light guide panel 503 surface on a surface that may abut the light emitting surface of the emitters 504a-b. The use of multi-sub pixel I LED array chips reduces the number of ILED array chips required and hence both the total area of ILED material and the number of placement steps. The limit of current available pick-and-place techniques is approx. 20 µm.

In summary, exemplary embodiments of the invention may be based on either or both of 2 components. Firstly, an ILED monolithic array (the ILED array chip) is used to generate light for the display. The use of a monolithic array with multiple I LED emitters is vital as it reduces the number of pick and place steps and the packaging complexity. The monolithic array is also important in that it enables the use of very small display sub pixels. More specifically, there is a limit on the size of chip that can be reliably "picked-and-placed" during assembly of approx. 20 µm. The use of monolithic array allows for example 4 emitter pixels to be on a chip of 20×20 µm with each pixel being 5 µm. This results in an efficient use of ILED material and therefore allows the current invention to be cost competitive.

The monolithic array is built on the LED device structure such that the generated light is controlled at the chip level. This allows each emitter in the monolithic array to efficiently illuminate its target pixel area. Overlap and cross-talk between pixels in a monolithic array is a potentially significant drawback as it would result in the unwanted illumination of neighboring pixels. This would reduce the absolute black that could be achieved by the display and hence the contrast. The crosstalk may also result in losses to the target pixel area of the display and hence reduce the overall efficiency. The use of collimated ILED emitters reduces the crosstalk as the light is controlled at the point of light generation. In order for the monolithic chip to be able to illuminate multiple display pixels the chip may be placed at the intersection of the pixels, see FIGS. 4-7.

Exemplary methods and apparatus may additionally, or alternatively include "secondary optics". These secondary optics are used to direct light into the target pixel area (i.e. the display pixel). As a consequence they will also serve to reduce the crosstalk between pixels.

The present applicant has identified that a ILED array chip containing a 2×2 monolithic array of ILED sub pixel emitters on a single chip can be used to illuminate multiple pixels within a display. The use of the array will reduce the total ILED array chip area relative to the size of a pixel, the total number of placement steps and the packaging requirements for the display. This design will allow for the construction of displays with high efficiency, high resolution over large area and/or pixel numbers while achieving a cost that is competitive with existing solutions.

The diagrams and discussions above describe a square chip with four pixels. However the current invention is applicable to designs of a number of geometries. Of particular relevance is a hexagon shaped ILED array chip containing 6 emitter pixels. In this embodiment each monolithic ILED array chip would contribute to 6 display pixels.

TABLE 1

Number of Pick-And-Place steps required for a given chip design

| Type | No of pixels (SVGA – 800 × 600) | Colours | Pixels per Pick and Place | Total P&P steps |
|---|---|---|---|---|
| Standard | 480,000 | 3 | 1 | 1,440,000 |
| Square 4 pixel monolithic | 480,000 | 3 | 4 | 360,000 |
| Hexagon 6 pixel monolithic | 480,000 | 3 | 6 | 240,000 |

TABLE 2

Area of LED material required for a given chip design.

| Type | No of pixels (SVGA – 800 × 600) | Colours | Pixels per Pick and Place | Total P&P steps |
|---|---|---|---|---|
| Standard | 1,440,000 | 20 × 20 | 400 | 576 |
| Square 4 pixel monolithic | 360,000 | 20 × 20 | 400 | 144 |
| Hexagon 6 pixel monolithic | 240,000 | 20 × 20 | 400 | 96 |

Exemplary embodiments of the invention may be defined by the following numbered clauses:
1. A method for constructing an efficient I LED display for low and high resolution such that
   a. I LED array chips containing one or a plurality of LED emitter arranged.
   b. LED emitters on a single chip are shared between neighboring pixels of the display
   c. I LED array chips are coupled to secondary optics to direct and control light for the LED emitters in a predetermined way in order to maximize the light directed to the pixel display region.
2. The I LED array chips can be square, rectangular, triangular, circular or a polygon shape.
3. The I LED array chips are configured I LED array chips are of a single color R,G,B or any other color necessary.
4. In one embodiment, the ILED display is mounted on largely transparent carrier such that the emitter light shines down through the carrier
5. In one embodiment, the I LED display contains Light Guide Panels which are machined into arrays of optically independent pixels having inter-pixel gaps between the optically independent pixels. The inter-pixel gaps are further filled with a dielectric and/or reflective material to substantially reduced optical crosstalk and enhance light collection efficiency,
6. As 1 where the secondary optics are integrated with ILED array chip.
7. As 1 where the secondary optics are integrated with Light Guide Panels.
8. As 1 where the secondary optics are on a panel or additional sheet that is integrated into the system design.

In one embodiment, the ILED display is mounted in a flip-chip configuration such that the light shines away from the carrier.

What is claimed is:
1. A display device, comprising:
a first inorganic light emitting diode (ILED) chip including a first ILED emitter, the first ILED emitter including a first area of first ILED emitter material configured to emit first light;
a second ILED chip including a second ILED emitter configured to emit second light, the second ILED emitter including a second area of second ILED emitter material configured to emit second light; and
a lightguide configured to receive the first light from the first ILED emitter and the second light from the second ILED emitter and output the first light and the second light at a light emission region of the lightguide, the light emission region defining a surface of a pixel of the display device, an area of the light emission region being larger than each of the first area of the first ILED emitter material of the first ILED emitter and the second area of the second ILED emitter material of the second ILED emitter.
2. The display device of claim 1, wherein a first subpixel of the pixel uses the first light from the first ILED emitter and a second subpixel of the pixel uses the second light from the second ILED emitter.
3. The display device of claim 1, further comprising a third ILED chip including a third ILED emitter configured to emit third light, and wherein the lightguide is configured to receive the third light from the third ILED emitter and output the third light at the light emission region of the lightguide.
4. The display device of claim 3, wherein the first light is red light, the second light is green light, and the third light is blue light.
5. The display device of claim 1, wherein the lightguide comprises:
a first side including an input region to receive the first light; and
a second side opposite the first side, the second side including the light emission region.
6. The display device of claim 5, wherein the lightguide further comprises reflector optics configured to reflect the first light coupled into the lightguide at the input region.
7. The display device of claim 6, wherein the reflector optics includes a corner reflector positioned in a corner of the lightguide at an intersection of the second side and a third side of the lightguide between the first and second sides.
8. The display of claim 5, wherein the lightguide further comprises a backreflector layer positioned along the second side of the lightguide to reflect the first light internally within the lightguide before emitting through the light emission region.
9. The display of claim 1, wherein the lightguide further comprises light extraction features at the light emission region, the light extraction features reducing internal reflection of the first light at the light emission region.
10. The display device of claim 9, wherein the light extraction features include ridged features.
11. The display device of claim 9, wherein the light extraction features are etched into a surface of the lightguide or mounted onto the surface of the lightguide.
12. The display device of claim 1, wherein the first ILED chip comprises a second ILED emitter.
13. The display device of claim 12, wherein the first and second ILED emitters of the first ILED chip emit light having the same color.

14. The display device of claim 1, wherein the first ILED chip is embedded in the lightguide.

15. The display device of claim 1, wherein the lightguide controls directionality of the first light outputted at the light emission region.

16. A display device, comprising:

inorganic light emitting diode (ILED) chips, each ILED chip including ILED emitters; and a lightguide including lightguide portions separated by interpixel gaps, each lightguide portion configured to receive light from adjacent ILED emitters of different ILED chips and output the light at a light emission region of the lightguide portion, the light emission region of each lightguide portion defining a surface of a pixel of the display device, the ILED emitters of each ILED chip provide light to different lightguide portions.

17. The display device of claim 16, wherein the adjacent ILED emitters that emit light into each of the lightguide portions include a first ILED emitter that emits a first color light and a second ILED emitter that emits a second color light different from the first color light.

18. The display device of claim 16, wherein:

each ILED emitter of each ILED chip includes an area of ILED emitter material; and an area of the light emission region of each lightguide portion is larger than the area of ILED emitter material of the adjacent ILED emitters that emit light into the lightguide portion.

19. The display device of claim 18, wherein:

each of the lightguide portions control directionality of the light output at the light emission region; and the interpixel gaps reduce interpixel crosstalk between the ILED emitters of each ILED chip.

* * * * *

UNITED STATES PATENT AND TRADEMARK OFFICE
CERTIFICATE OF CORRECTION

| | |
|---|---|
| PATENT NO. | : 11,158,613 B2 |
| APPLICATION NO. | : 16/882197 |
| DATED | : October 26, 2021 |
| INVENTOR(S) | : William Henry et al. |

It is certified that error appears in the above-identified patent and that said Letters Patent is hereby corrected as shown below:

In the Claims

In Column 12, Line 49, Claim 8, replace "display of" with -- display device of --, and In Column 12, Line 54, Claim 9, replace "display of" with -- display device of --.

Signed and Sealed this
Eighth Day of March, 2022

Drew Hirshfeld
*Performing the Functions and Duties of the*
*Under Secretary of Commerce for Intellectual Property and*
*Director of the United States Patent and Trademark Office*